(12) United States Patent
Korzenski et al.

(10) Patent No.: US 7,557,073 B2
(45) Date of Patent: Jul. 7, 2009

(54) NON-FLUORIDE CONTAINING SUPERCRITICAL FLUID COMPOSITION FOR REMOVAL OF ION-IMPLANT PHOTORESIST

(75) Inventors: Michael B. Korzenski, Danbury, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 163 days.

(21) Appl. No.: 10/827,395

(22) Filed: Apr. 19, 2004

(65) Prior Publication Data

US 2004/0198622 A1    Oct. 7, 2004

Related U.S. Application Data

(63) Continuation-in-part of application No. 10/303,450, filed on Nov. 25, 2002, now Pat. No. 7,326,673.

(60) Provisional application No. 60/345,900, filed on Dec. 31, 2001.

(51) Int. Cl.
C11D 7/50 (2006.01)
(52) U.S. Cl. .................. 510/175; 510/176; 510/177
(58) Field of Classification Search .............. 510/175, 510/176, 177
See application file for complete search history.

(56) References Cited

U.S. PATENT DOCUMENTS

| | | | | |
|---|---|---|---|---|
| 4,036,731 A | * | 7/1977 | Martin | ................ 208/431 |
| 5,043,280 A | * | 8/1991 | Fischer et al. | ............ 435/235.1 |
| 5,306,350 A | * | 4/1994 | Hoy et al. | ................ 134/22.14 |
| 5,565,616 A | * | 10/1996 | Li et al. | ...................... 585/700 |
| 5,866,005 A | | 2/1999 | DeSimone et al. | |
| 5,868,862 A | | 2/1999 | Douglas et al. | |
| 5,944,996 A | | 8/1999 | DeSimone et al. | |
| 6,186,153 B1 | | 2/2001 | Kitsunai et al. | |
| 6,235,701 B1 | | 5/2001 | Senger Elsbernd | |
| 6,242,165 B1 | | 6/2001 | Vaartstra | |
| 6,270,531 B1 | | 8/2001 | DeYoung et al. | |
| 6,277,753 B1 | * | 8/2001 | Mullee et al. | ............... 438/692 |
| 6,331,487 B2 | * | 12/2001 | Koch | .......................... 438/692 |
| 6,398,875 B1 | * | 6/2002 | Cotte et al. | ..................... 134/2 |

(Continued)

FOREIGN PATENT DOCUMENTS

WO    96/27704 B    9/1996

OTHER PUBLICATIONS

Advanced Technology Materials, Inc., International Application PCT/US05/012301, "International Search Report", Sep. 15, 2006.

*Primary Examiner*—Gregory E Webb
(74) *Attorney, Agent, or Firm*—Chih-Sheng Lin; Tristan A. Fuierer; Moore & VanAllen, PLLC

(57) ABSTRACT

A method and composition for removing ion-implanted photoresist from semiconductor substrates having such photoresist is described. The removal composition contains supercritical $CO_2$ ($SCCO_2$), a co-solvent and a reducing agent for use in removing ion-implanted photoresist. Such removal composition overcomes the intrinsic deficiency of $SCCO_2$ as a removal reagent, viz., the non-polar character of SCCO2 and its associated inability to solubilize species such as inorganic salts and polar organic compounds that are present in the photoresist and that must be removed from the semiconductor substrate for efficient cleaning.

22 Claims, 1 Drawing Sheet

U.S. PATENT DOCUMENTS

| | | | |
|---|---|---|---|
| 6,403,544 B1 * | 6/2002 | Davenhall et al. | 510/175 |
| 6,425,956 B1 * | 7/2002 | Cotte et al. | 134/2 |
| 6,438,867 B1 * | 8/2002 | Teich et al. | 34/470 |
| 6,500,605 B1 * | 12/2002 | Mullee et al. | 430/329 |
| 6,509,141 B2 | 1/2003 | Mullee | |
| 6,562,146 B1 * | 5/2003 | DeYoung et al. | 134/30 |
| 6,756,084 B2 * | 6/2004 | Fulton et al. | 427/458 |
| 6,838,015 B2 * | 1/2005 | Cotte et al. | 252/79.1 |
| 6,890,853 B2 * | 5/2005 | Biberger et al. | 438/670 |
| 6,893,995 B2 * | 5/2005 | Thomas et al. | 502/152 |
| 2002/0001929 A1 * | 1/2002 | Biberger et al. | 438/584 |
| 2002/0088477 A1 * | 7/2002 | Cotte et al. | 134/2 |
| 2004/0214002 A1 * | 10/2004 | Granick et al. | 428/411.1 |
| 2005/0124516 A1 * | 6/2005 | Davenhall et al. | 510/175 |
| 2005/0158414 A1 * | 7/2005 | Krasutsky et al. | 424/771 |
| 2005/0224748 A1 * | 10/2005 | Cotte et al. | 252/79.1 |

* cited by examiner

NON-FLUORIDE CONTAINING SUPERCRITICAL FLUID COMPOSITION FOR REMOVAL OF ION-IMPLANT PHOTORESIST

CROSS REFERENCE TO RELATED APPLICATIONS

This is a continuation-in-part of U.S. patent application Ser. No. 10/303,450 for "Supercritical Fluid Cleaning of Semiconductor Substrates," filed on Nov. 25, 2002 now U.S. Pat. No. 7,326,673 in the name of Chongying Xu et al., which claims priority to U.S. Provisional Patent Application No. 60/345,900 for "Supercritical Fluid Cleaning of Semiconductor Substrates," filed on Dec. 31, 2001 in the name of Chongying Xu et al.

FIELD OF THE INVENTION

The present invention relates to non-fluoride containing supercritical fluid (SCF)-based compositions useful in semiconductor manufacturing for the removal of photoresists, including ion-implanted photoresists, from substrates having such photoresists thereon, and to methods of using such compositions for removal of ion-implanted photoresists from semiconductor substrates.

DESCRIPTION OF THE RELATED ART

As semiconductor devices become more integrated and miniaturized, ion implantation has become more extensively employed to accurately control impurity distributions in the semiconductor substrate. During this process, a patterned photoresist is often used for the selected implant of ions.

A photoresist layer includes a polymer material or resin and a sensitizer which is a photoactive compound. A mask is utilized to expose portions of the photoresist layer to ultraviolet (UV) light and then the photoresist layer is developed, resulting in a patterned resist layer. The patterned resist layer is used so that only selected portions of an underlying substrate are implanted with ions during ion implantation. Importantly, the resist layer must be removed following ion implantation, prior to proceeding to the next step in the fabrication of the semiconductor device.

However, exposure of the photoresist to the high-dose, e.g., $>1 \times 10^{15}$ atoms/cm$^2$, ion implantation process depletes the surface of the photoresist of hydrogen, transforming it into a tough, carbonized, highly-cross-linked crust. Conventional methods of removing the hardened photoresist include oxygen-plasma ashing, often in combination with halogen gases, to penetrate the crust and remove the photoresist. Typically, the plasma ashing process requires a follow-up cleaning with wet chemicals and/or dilute acids to remove residues and non-volatile contaminants that remain, to ensure proper operation of the microelectronic device, and to avoid interference or deficiency in relation to subsequent process steps in the manufacturing process.

A number of problems and deficiencies of such ashing and wet cleaning operations have been encountered in their application, including:

(1) popping of the photoresist (leading to associated contamination of the semiconductor substrate) from the substrate surface, as the heated, residual solvent in the bulk photoresist vaporizes under the hardened crust;

(2) occurrence of residual metal contamination due to the presence of non-volatile metal compounds implanted into the photoresist that are not completely removed by the plasma ashing process;

(3) production of tough residues (of polymerized crust or highly cross-linked polymer) that remain on the semiconductor substrate despite the use of plasma ashing and wet chemical treatments;

(4) necessity of repetitive cleaning steps that increase photoresist stripping cycle times and work-in-process steps; and (5) substantial quantities of wet chemicals and/or dilute acids that must be disposed of.

Significant and continuing efforts have been made in the semiconductor manufacturing industry to develop improved formulations for removing ion-implant hardened photoresists and residues thereof from the semiconductor substrate. This effort has been frustrated by the continuing and rapid decrease in critical dimensions. Conventional wet-cleaning methods, including aqueous-based compositions, suffer substantial limitations as critical dimension (CD) widths decrease below 100 nm, due to the high surface tension characteristics of liquids used in the cleaning solution. Additionally, aqueous cleaning solutions can strongly affect important material properties of porous low-k dielectric materials, including mechanical strength, moisture uptake, coefficient of thermal expansion, and adhesion to different substrates.

Supercritical fluids (SCF) provide an alternative method for removing photoresists from the semiconductor surface. SCFs diffuse rapidly, have low viscosity, near zero surface tension, and can penetrate easily into deep trenches and vias. Further, because of their low viscosity, SCFs can rapidly transport dissolved species. However, SCFs are highly non-polar and as such, many species are not adequately solubilized therein.

It would therefore be a significant advance in the art to provide effective SCF-based compositions for the removal of ion-implanted photoresists from semiconductor substrates that overcome such deficiencies of the conventional removal compositions and methodologies.

SUMMARY OF THE INVENTION

The present invention relates to non-fluoride containing SCF-based compositions useful in semiconductor manufacturing for the removal of photoresists, including ion-implanted photoresists, from substrates having such photoresists thereon. The present invention also relates to methods of using such SCF-based compositions for removal of ion-implanted photoresists from semiconductor substrates.

In one aspect, the invention relates to a ion-implanted photoresist removal composition, comprising at least one SCF, at least one co-solvent, and at least one reducing agent.

In another aspect, the invention relates to a method of removing ion-implanted photoresist from a substrate having same thereon, said method comprising contacting the substrate having the ion-implanted photoresist thereon with an SCF-based composition comprising at least one SCF, at least one co-solvent, and at least one reducing agent, for sufficient time and under sufficient contacting conditions to remove the ion-implanted photoresist from the substrate.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
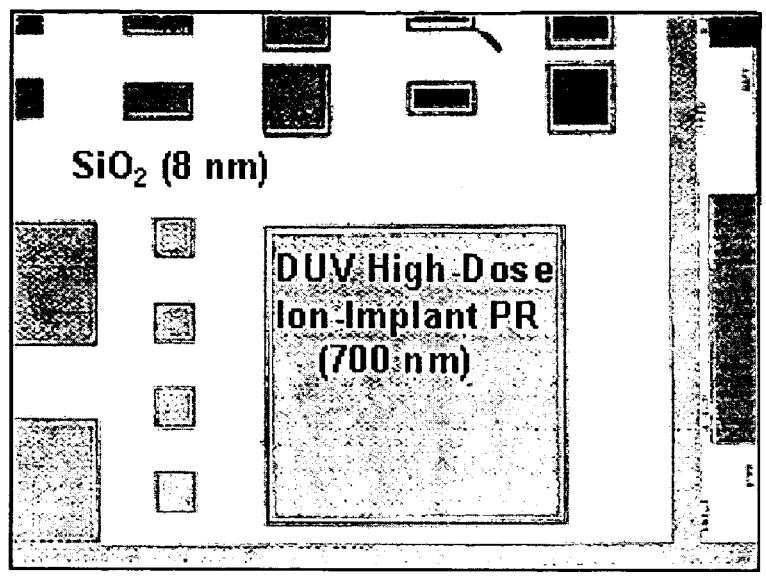
FIG. 1 is an optical image of a high-dose ion-implanted photoresist-bearing control wafer.

The present invention is based on the discovery of a non-fluoride containing supercritical fluid (SCF)-based composition useful for the removal of photoresists, including ion-implanted photoresists, from semiconductor substrates having such photoresists thereon. Specifically, the present invention relates to the removal of ion-implanted photoresist from patterned semiconductor wafers using the SCF-based compositions described herein.

Because of its readily manufactured character and its lack of toxicity and negligible environmental effects, supercritical carbon dioxide ($SCCO_2$) is a preferred SCF in the broad practice of the present invention, although the invention may be practiced with any suitable SCF species, with the choice of a particular SCF depending on the specific application involved. Other preferred SCF species useful in the practice of the invention include oxygen, argon, krypton, xenon, and ammonia. Specific reference to $SCCO_2$ hereinafter in the broad description of the invention is meant to provide an illustrative example of the present invention and is not meant to limit the same in any way.

$SCCO_2$ is often regarded as an attractive reagent for removal of unwanted species and/or layers from the surface of a semiconductor wafer, since $SCCO_2$ has the characteristics of both a liquid and a gas. Like a gas, it diffuses rapidly, has low viscosity, near-zero surface tension, and penetrates easily into deep trenches and vias. Like a liquid, it has bulk flow capability as a "wash" medium.

However, despite these ostensible advantages, $SCCO_2$ is non-polar. Accordingly, it will not solubilize many ionic or polar species, including inorganic salts and polar photoresist material, that must be removed from the semiconductor substrate for efficient cleaning. The non-polar character of $SCCO_2$ thus poses an impediment to the use of such reagent for photoresist removal subsequent to further processing steps in the fabrication of the semiconductor device.

The present invention, however, is based on the discovery that disadvantages associated with the non-polarity of $SCCO_2$ and other SCFs can be overcome by appropriate formulation of non-fluoride containing $SCCO_2$-based compositions with additives as hereinafter more fully described, and the accompanying discovery that removing photoresist and ion-implanted photoresist from a substrate with a $SCCO_2$-based medium is highly effective and achieves damage-free, residue-free removal of the photoresist from the substrate, e.g., a patterned ion implanted semiconductor wafer, having same thereon.

In one aspect, the invention relates to non-fluoride containing $SCCO_2$-based compositions useful in removing ion implanted photoresist from a semiconductor substrate. The formulation of the present invention comprises $SCCO_2$, at least one co-solvent, and at least one reducing agent, present in the following ranges, based on the total weight of the composition:

| component of | % by weight |
| --- | --- |
| $SCCO_2$ | about 60.0% to about 90.0% |
| co-solvent | about 10.0% to about 30.0% |
| reducing agent | about 0.01% to about 5.0% |

In the broad practice of the invention, the $SCCO_2$-based composition may comprise, consist of, or consist essentially of $SCCO_2$, at least one co-solvent, and at least one reducing agent.

The inclusion of the co-solvent with $SCCO_2$ serves to increase the solubility of the composition for photoresist and ion implanted photoresist species, in a manner providing a striking improvement in removal ability of the composition for photoresists, relative to $SCCO_2$ alone. The co-solvent used in the $SCCO_2$-based removal composition is preferably an alcohol. In one embodiment of the invention, such alcohol includes a straight-chain or branched $C_1$-$C_6$ alcohol (i.e., methanol, ethanol, isopropanol, etc.), or a mixture of two or more of such alcohol species. In another embodiment of the invention, the co-solvent is an amine including monoethanolamine and triethanolamine. In a preferred embodiment, the alcohol is isopropanol (IPA).

The reducing agent is included to improve the effectiveness of ion-implanted photoresist removal using the SCF-based compositions described herein. The reducing agents used in the SCF-based compositions include formic acid, hydrogen gas, formaldehyde, formalin, boranes, diboranes, amine stabilized boranes ($R_3N.BH_4$) (where R is a straight-chained or branched $C_1$-$C_4$ alkyl group), amine stabilized alanes ($R_3N.AlH_3$) (where R is a straight-chained or branched $C_1$-$C_4$ alkyl group), tetraalkyl amines of $BH_4$ and $AlH_4$ (where the alkyls are straight-chained or branched $C_1$-$C_4$ groups) and other hydrogen-generating compounds.

In general, the specific proportions and amounts of $SCCO_2$, co-solvent, and reducing agent in relation to each other may be suitably varied to provide the desired solubilizing (solvating) action of the $SCCO_2$/co-solvent/reducing agent composition for the photoresist and ion-implanted photoresist to be cleaned from the substrate. Such specific proportions and amounts are readily determinable by simple experiment within the skill of the art without undue effort.

The removal efficiency of the $SCCO_2$/co-solvent/reducing agent composition may be enhanced by use of elevated temperature conditions in the contacting of the photoresist to be removed with the $SCCO_2$-based composition.

The $SCCO_2$-based compositions of the invention may optionally be formulated with additional components to further enhance the removal capability of the composition, or to otherwise improve the character of the composition. Accordingly, the composition may be formulated with stabilizers, chelating agents, oxidation inhibitors, complexing agents, etc.

In one embodiment, the SCF-based composition of the invention includes $SCCO_2$, IPA, and formic acid.

In another aspect, the invention relates to methods of removal of photoresist, including ion-implanted photoresist, from a semiconductor wafer surface using the $SCCO_2$-based compositions described herein.

The $SCCO_2$-based compositions of the present invention overcome the disadvantages of the prior art ion-implanted photoresist removal techniques by (i) minimizing the volume of chemical reagents needed, thus reducing the quantity of waste, and (ii) minimizing popping and contaminating residue formation, while simultaneously providing a composition and method having recyclable constituents, e.g., the SCFs.

The appropriate $SCCO_2$-based composition can be employed to contact a wafer surface having ion-implanted photoresist thereon at a pressure in a range of from about 1500 psi to about 4500 psi for sufficient time to effect the desired removal of the photoresist, e.g., for a contacting time in a range of from about 1 minute to about 20 minutes and a temperature of from about 30° C. to about 100° C., although greater or lesser contacting durations and temperatures may be advantageously employed in the broad practice of the present invention, where warranted. In a preferred embodiment, the contacting temperature is in the range of from about 50° C. to about 90° C., preferably about 70° C.

The effect of specific temperature increases and temperature ranges on the nature and extent of the removal of photoresist in the practice of the invention may be readily empirically determined by varying the temperature to specific values and measuring the amount of photoresist material removed from the substrate by the $SCCO_2$-based composition at that temperature. In such manner, optimal temperature levels may be determined for a specific $SCCO_2$-based composition of the invention, for the specific photoresist material to be removed.

In like manner, the process conditions other than temperature may be selected and optimal or otherwise advantageous conditions determined within the skill of the art, including the superatmospheric pressure at which the supercritical fluid composition is contacted with the ion-implanted photoresist to be removed from the substrate, the flow and/or static character of the $SCCO_2$-based composition contacting, and the duration of the contacting.

The wafer surface containing the ion implanted photoresist may be processed by dynamically flowing or statically soaking the $SCCO_2$-based composition over the wafer surface containing the photoresist.

A "dynamic" contacting mode involves continuous flow of the composition over the wafer surface, to maximize the mass transfer gradient and effect complete removal of the photoresist from the surface. A "static soak" contacting mode involves contacting the wafer surface with a static volume of the composition, and maintaining contact therewith for a continued (soaking) period of time.

The removal process in a particularly preferred embodiment includes sequential processing steps including dynamic flow of the $SCCO_2$-based composition over the wafer surface containing the ion-implanted photoresist, followed by a static soak of the wafer in the $SCCO_2$-based composition, with the respective dynamic flow and static soak steps being carried out alternatingly and repetitively, in a cycle of such alternating steps.

For example, the dynamic flow/static soak steps may be carried out for four successive cycles in the aforementioned illustrative embodiment, as including a sequence of 2.5 min-10 min dynamic flow, 2.5 min-5 min high pressure static soak, e.g., about 3000 psi to about 4500 psi, 2.5 min-10 min dynamic flow, and 2.5 min-10 min low pressure static soak, e.g., about 1500 psi to about 2900 psi. In a preferred embodiment, the sequence consists of a 5 min dynamic flow and a 5 min static soak at 3000-4500 psi.

Following the contacting of the $SCCO_2$-based composition with the wafer surface, the wafer thereafter preferably is washed with copious amounts of SCF/alcohol solution in a first washing step, to remove any residual precipitated chemical additives from the region of the wafer surface in which particle removal has been effected, and finally with copious amounts of pure SCF, in a second washing step, to remove any residual methanol and/or precipitated chemical additives from the wafer surface. Preferably, the SCF used for washing is $SCCO_2$.

The co-solvent/reducing agent component of the $SCCO_2$-based compositions of the present invention is readily formulated by simple mixing of ingredients, e.g., in a mixing vessel under gentle agitation.

Once formulated, such $SCCO_2$-based compositions are applied to the wafer surface for contacting with the ion-implanted photoresist thereon, at suitable elevated pressures, e.g., in a pressurized contacting chamber to which the $SCCO_2$-based composition is supplied at suitable volumetric rate and amount to effect the desired contacting operation for removal of the ion-implanted photoresist from the wafer surface.

It will be appreciated that specific contacting conditions for the $SCCO_2$-based compositions of the invention are readily determinable within the skill of the art, based on the disclosure herein, and that the specific proportions of ingredients and concentrations of ingredients in the $SCCO_2$-based compositions of the invention may be widely varied while achieving desired removal of the ion implanted photoresist from the wafer surface.

The features and advantages of the invention are more fully shown by the illustrative examples discussed below.

The sample wafers examined in this study were $Si/SiO_2$ patterned wafers having DUV high-dose ion-implanted photoresist layers thereon. Various chemical additives, as described herein, were added to the $SCCO_2$-based composition and photoresist removal efficiency evaluated. The temperature of the $SCCO_2$-based composition was maintained at 70° C. throughout the removal experiments. Following layer removal, the wafers were thoroughly rinsed with copious amounts of $SCCO_2$/IPA and pure $SCCO_2$ in order to remove any residual solvent and/or precipitated chemical additives. The results are shown in FIGS. 1-2, as described hereinbelow.

By way of specific example, FIG. 1 is an optical microscope image of a deep ultraviolet (DUV) high-dose ion-implanted photoresist-bearing control wafer.

Figure 2:
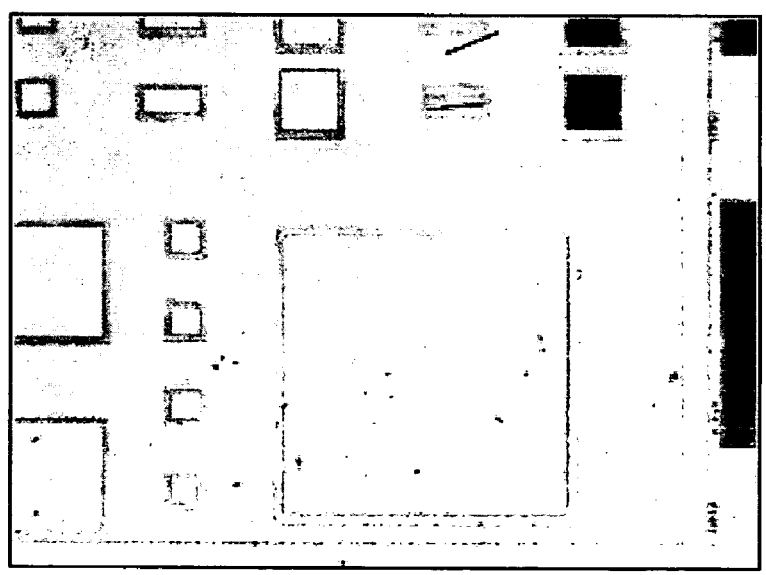
FIG. 2 is an optical image of the wafer of FIG. 1, following cleaning of the wafer using a supercritical carbon dioxide (SCCO$_2$)/isopropanol (IPA)/formic acid solution at 70° C. and 3000 psi, showing complete removal of photoresist with only slight etching of the surrounding SiO$_2$ layer.

FIG. 2 is an optical image of a corresponding post-cleaned sample, which was cleaned of photoresist by contact of the photoresist-bearing substrate with a cleaning composition of SCCO2/IPA/formic acid, at 70° C. and 3000 psi. As observed in FIG. 2, the photoresist was completely removed under these conditions. It can be concluded that alcohols plus reducing agents are effective for high-dose ion-implanted photoresist removal.

The above-described photographs thus evidence the efficacy of $SCCO_2$-based compositions in accordance with the invention, for removal of ion-implanted photoresist from wafer surfaces.

The following formulation resulted in substantial removal of ion-implanted photoresist from the patterned $Si/SiO_2$ surface. "Substantial removal" is defined as greater than about 98% removal of the photoresist from the semiconductor device, as determined by optical microscopy. In this specific embodiment, 100% removal of the ion-implanted photoresist was observed in all areas in 9 minutes at 70° C. and 3000 psi.

| Component | Weight Percent |
|---|---|
| formic acid (96%) | 0.60 |
| isopropyl alcohol | 6.0 |
| $SCCO_2$ | 93.4 |

Accordingly, while the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. A SCF-based removal composition consisting of at least one supercritical fluid (SCF), at least one co-solvent, and at least one reducing agent, wherein the at least one reducing agent consists of at least one of hydrogen gas, formaldehyde, formalin, boranes, diboranes, amine stabilized boranes, amine stabilized alanes, and tetraalkyl amines of $BH_4$ and $AlH_4$, and wherein the at least one SCF consists of a fluid selected from the group consisting of carbon dioxide, oxygen, argon, krypton, and xenon.

2. The removal composition of claim 1, wherein the SCF consists of carbon dioxide.

3. The removal composition of claim 1, wherein the co-solvent consists of a species selected from the group consisting of at least one straight-chain $C_1$-$C_6$ alcohol, branched $C_1$-$C_6$ alcohol, and an amine.

4. The removal composition of claim 1, wherein the co-solvent consists of isopropanol (IPA).

5. The removal composition of claim 1, wherein the composition is non-fluoride containing.

6. The removal composition of claim 1, wherein the SCF-based removal composition consists of about 60.0 wt % to about 90.0 wt % SCF, about 10.0 wt % to about 30.0 wt % co-solvent, and about 0.01 wt % to about 5.0 wt % reducing agent, based on the total weight of the composition.

7. A method of removing ion-implanted photoresist from a substrate having same thereon, said method comprising contacting the substrate having the ion-implanted photoresist thereon with an SCF-based composition consisting of at least one SCF, at least one co-solvent, and at least one reducing agent, for sufficient time and under sufficient contacting conditions to remove the ion-implanted photoresist from the substrate wherein the at least one reducing agent consists of at least one of hydrogen gas, formaldehyde, formalin, boranes, diboranes, amine stabilized boranes, amine stabilized alanes, and tetraalkyl amines of BH4 and AlH4, and wherein the at least one SCF consists of a fluid selected from the group consisting of carbon dioxide, oxygen, argon, krypton, and xenon.

8. The method of claim 7, wherein the SCF consists of carbon dioxide.

9. The method of claim 7, wherein the contacting conditions comprise pressure in a range of from about 1500 psi to about 4500 psi.

10. The method of claim 7, wherein said contacting time is in a range of from about 1 minutes to about 20 minutes.

11. The method of claim 7, wherein the co-solvent consists of a species selected from the group consisting of at least one straight-chain $C_1$-$C_6$ alcohol, branched $C_1$-$C_6$ alcohol, and an amine.

12. The method of claim 7, wherein the co-solvent consists of isopropanol (IPA).

13. The method of claim 7, wherein the SCF-based composition consists of about 60.0 wt% to about 90.0 wt% SCF, about 10.0 wt% to about 30.0 wt% co-solvent, and about 0.01 wt% to about 5.0 wt% reducing agent, based on the total weight of the composition.

14. The method of claim 7, wherein the contacting step comprises a cycle including (i) dynamic flow contacting of the SCF-based composition with the substrate having the ion-implanted photoresist, and (ii) static soaking contacting of the SCF-based composition with the substrate having the ion-implanted photoresist thereon.

15. The method of claim 14, wherein said cycle comprises alternating and repetitively carrying out dynamic flow contacting (i) and static soaking contacting (ii) of the substrate having the ion-implanted photoresist thereon.

16. The method of claim 7, further comprising washing the substrate, at a region at which the ion implanted photoresist has been removed, with a SCF/isopropanol water wash solution in a first washing step, and with a SCF in a second washing step, to remove residual precipitated chemical additives in said first washing step, and to remove residual precipitated chemical additives in said washing step, and to remove residual precipitated chemical additives and/or residual alcohol in said second washing step.

17. The method of claim 16, wherein the SCE is $SCCO_2$.

18. The method of claim 7, wherein the containing conditions comprise temperature in a range of from about 50° C. to about 90 °C.

19. The method of claim 7, wherein the photoresist was exposed to a high-dose ion-implantation process, wherein the high-dose ion implantation rate is greater than $1\times10^{15}$ atoms/$cm^2$.

20. A SCF-based removal composition comprising at least one co-solvent, at least one reducing agent, and ion-implanted photoresist residue material, wherein the reducing agent comprises at least one of hydrogen gas, formaldehyde, formalin, boranes, diboranes, amine stabilized boranes, amine stabilized alanes, and tetraalkyl amines of $BH_4$ and $AlH_4$.

21. A semiconductor device fabricated using the composition of claim 1.

22. A method of removing ion-implanted photoresist from a substrate having same thereon, said method comprising contacting the substrate having the ion-implanted photoresist thereon with the SCF-based composition of claim 20.

* * * * *